(12) United States Patent
Fukui

(10) Patent No.: US 8,967,825 B2
(45) Date of Patent: Mar. 3, 2015

(54) LED LAMP WITH CHIP SUPPORTED BY HEAT-DISSIPATING MEMBER

(75) Inventor: Hiroyuki Fukui, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 294 days.

(21) Appl. No.: 13/144,628

(22) PCT Filed: Jan. 19, 2010

(86) PCT No.: PCT/JP2010/050518
§ 371 (c)(1),
(2), (4) Date: Jul. 14, 2011

(87) PCT Pub. No.: WO2010/082655
PCT Pub. Date: Jul. 22, 2010

(65) Prior Publication Data
US 2011/0273871 A1    Nov. 10, 2011

(30) Foreign Application Priority Data
Jan. 19, 2009    (JP) ................ 2009-008761

(51) Int. Cl.
| | |
|---|---|
| F21V 7/22 | (2006.01) |
| F21K 99/00 | (2010.01) |
| F21V 23/00 | (2006.01) |
| F21V 29/00 | (2006.01) |
| F21S 4/00 | (2006.01) |
| F21Y 101/02 | (2006.01) |
| F21Y 103/00 | (2006.01) |

(52) U.S. Cl.
CPC .............. *F21K 9/17* (2013.01); *F21V 23/006* (2013.01); *F21V 29/004* (2013.01); *F21S 4/008* (2013.01); *F21Y 2101/02* (2013.01); *F21Y 2103/003* (2013.01)
USPC ..................... 362/218; 362/373; 362/294

(58) Field of Classification Search
CPC .... F21S 4/008; F21Y 2103/003; F21V 29/22; F21V 29/002; F21V 29/20; F21K 9/17
USPC ................... 362/249.02, 235, 294, 218, 373, 362/221–223, 800
See application file for complete search history.

(56) References Cited

U.S. PATENT DOCUMENTS

| | | | | |
|---|---|---|---|---|
| 7,648,251 B2 * | 1/2010 | Whitehouse et al. | ......... | 362/223 |
| 7,976,196 B2 * | 7/2011 | Ivey et al. | ..................... | 362/294 |
| 8,220,956 B2 * | 7/2012 | Lai et al. | ....................... | 362/218 |
| 8,274,241 B2 * | 9/2012 | Guest et al. | .................. | 315/294 |
| 8,282,247 B2 * | 10/2012 | Ivey et al. | ..................... | 362/294 |
| 8,360,599 B2 * | 1/2013 | Ivey et al. | ..................... | 362/218 |

(Continued)

FOREIGN PATENT DOCUMENTS

| | | |
|---|---|---|
| JP | U-1994054103 | 7/1994 |
| JP | 2002-199837 | 7/2002 |
| JP | 2004-109407 | 4/2004 |
| JP | 3145640 | 10/2008 |

*Primary Examiner* — Robert May
(74) *Attorney, Agent, or Firm* — Hamre, Schumann, Mueller & Larson, P.C.

(57) ABSTRACT

An LED lamp (A1) includes LED chips (21) and a heat dissipation member (3) that supports the LED chips (21), and the heat dissipation member (3) includes an LED mount (31) on which the LED chips (21) are mounted, and a slope portion (32) extending from the LED mount (31) opposite a main emission direction of the LED chips (21) and in a direction inclined with respect to the main emission direction. Such a configuration allows a wider range to be illuminated.

15 Claims, 6 Drawing Sheets

(56) References Cited

U.S. PATENT DOCUMENTS

| | | | |
|---|---|---|---|
| 2004/0114367 A1* | 6/2004 | Li | 362/248 |
| 2004/0179357 A1* | 9/2004 | Kappe | 362/222 |
| 2010/0102729 A1* | 4/2010 | Katzir et al. | 315/113 |
| 2010/0157608 A1* | 6/2010 | Chen et al. | 362/296.01 |
| 2011/0128742 A9* | 6/2011 | Yuen et al. | 362/294 |

* cited by examiner

US 8,967,825 B2

LED LAMP WITH CHIP SUPPORTED BY HEAT-DISSIPATING MEMBER

TECHNICAL FIELD

The present invention relates to an LED lamp that employs an LED as a light source, and can be employed as a substitute for a fluorescent lamp.

BACKGROUND ART

FIGS. 8 and 9 depict an example of a conventional LED lamp including LEDs as the light source (see, for example, patent document 1). The LED lamp X shown in these drawings includes a plate-shaped substrate 91, a plurality of LED modules 92 mounted on the substrate 91, a heat dissipation member 95 attached to the substrate 91, a case 93 that encloses therein the substrate 91, and a terminal 94. An interconnect pattern (not shown) connected to the LED modules 92 and the terminal 94 is provided on the substrate 91. The LED lamp X is configured to cause the plurality of LED modules 92 to emit a light upon fitting the terminal 94 to an inlet of a socket for a home-use fluorescent illumination instrument.

Here, the home-use fluorescent illumination instrument refers to an illumination instrument mainly used for general interior illumination, more specifically to an illumination instrument that utilizes, for example in Japan, the commercial power supply of 100 V, and is compatible with a straight-tube fluorescent lamp according to JIS C7617 or a circular fluorescent lamp according to JIS C7618.

The light from the LED module 92 presents such a light distribution that a majority of the light concentrates in a main emission direction indicated by arrows pointing upward in FIG. 9. Accordingly, the LED lamp X is normally attached such that the main emission direction is oriented toward a floor opposite a ceiling 96. However, a portion of the light from the LED module 92 travelling opposite the main emission direction is blocked by the substrate 91. Thus, the LED lamp X has a drawback in that the ceiling 96 remains dark compared with a situation where the home-use fluorescent lamp is turned on.

PRIOR ART DOCUMENT

Patent Document

Patent document 1: JP-U-H06-54103

SUMMARY OF THE INVENTION

Problem to be Solved by the Invention

The present invention has been proposed in view of the foregoing situation, with an object to provide an LED lamp that can suppress an uncomfortable feeling arising from comparison with a situation where a home-use fluorescent lamp is turned on.

Means for Solving the Problem

A first aspect of the present invention provides an LED lamp comprising an LED chip, and a heat dissipation member that supports the LED chip, wherein the heat dissipation member includes an LED mount on which the LED chip is mounted, and at least one slope portion extending from the LED mount opposite a main emission direction of the LED chip and in a direction inclined with respect to the main emission direction.

In a preferred embodiment of the present invention, the LED lamp may comprise a pair of the slope portions located so as to oppose each other across an axis passing the LED chip and extending in the main emission direction, and disposed so as to define therebetween an angle equal to or smaller than 180°.

In a preferred embodiment of the present invention, the LED lamp may further comprise a cylindrical case that accommodates therein the heat dissipation member and diffusingly transmits a light from the LED chip.

In a preferred embodiment of the present invention, the heat dissipation member may be smaller in size in a radial direction of the case than a radius of the case.

In a preferred embodiment of the present invention, the case may include a pair of projections inwardly sticking so as to hold the heat dissipation member therebetween.

In a preferred embodiment of the present invention, the slope portion of the heat dissipation member may have a flat surface.

In a preferred embodiment of the present invention, the slope portion of the heat dissipation member may have a stair-shaped surface.

In a preferred embodiment of the present invention, the heat dissipation member may include a hollow portion in which a circuit board that activates the LED chip is provided.

A second aspect of the present invention provides an LED lamp comprising an LED chip, a heat dissipation member that supports the LED chip, and a cylindrical case that accommodates therein the heat dissipation member and diffusingly transmits a light from the LED chip, wherein the case includes a pair of projections inwardly sticking so as to hold the heat dissipation member therebetween.

In a preferred embodiment of the present invention, the heat dissipation member may have a fan-shaped cross-section including an LED mount on which the LED chip is mounted and a pair of slope portions extending from the LED mount.

In a preferred embodiment of the present invention, the pair of projections may be engaged with a respective end portion of the pair of slope portions.

In a preferred embodiment of the present invention, the pair of slope portions may be disposed so as to define therebetween an angle equal to or smaller than 180°.

In a preferred embodiment of the present invention, the heat dissipation member may be smaller in size in a radial direction of the case than a radius of the case.

In a preferred embodiment of the present invention, the heat dissipation member may include a hollow portion in which a circuit board that activates the LED chip is provided.

A third aspect of the present invention provides an LED lamp comprising an LED chip, and a heat dissipation member that supports the LED chip, wherein the heat dissipation member includes a hollow portion in which a circuit board that activates the LED chip is provided.

In a preferred embodiment of the present invention, the heat dissipation member may be formed in a slender shape having a fan-shaped cross-section including an LED mount on which the LED chip is mounted and a pair of slope portions extending from the LED mount.

In a preferred embodiment of the present invention, the circuit board may have a strip shape extending in a longitudinal direction of the heat dissipation member.

In a preferred embodiment of the present invention, the pair of slope portions may be disposed so as to define therebetween an angle equal to or smaller than 180°.

In a preferred embodiment of the present invention, the heat dissipation member may be smaller in size in a radial direction of the case than a radius of the case.

In a preferred embodiment of the present invention, the LED lamp may further comprise a cylindrical case that accommodates therein the heat dissipation member and diffusingly transmits a light from the LED chip, and the case may include a pair of projections inwardly sticking so as to hold the case therebetween.

Other features and advantages of the present invention will become more apparent through detailed description given hereunder with reference to the attached drawings.

MODE FOR CARRYING OUT THE INVENTION

Figure 1:
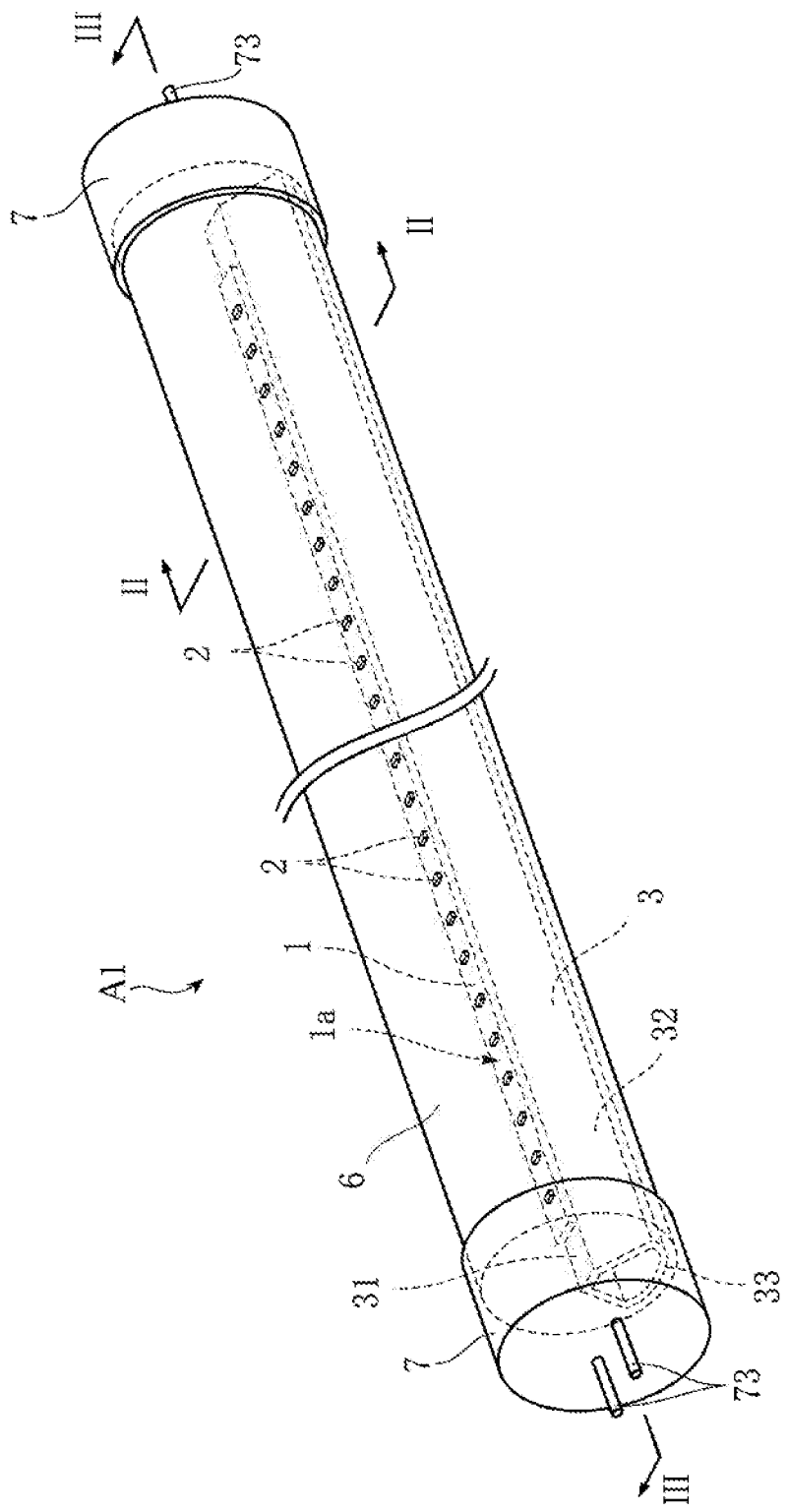
FIG. 1 is a perspective view showing an LED lamp according to a first embodiment of the present invention.

Hereunder, preferred embodiments of the present invention will be described in details, referring to the drawings.

Figure 2:
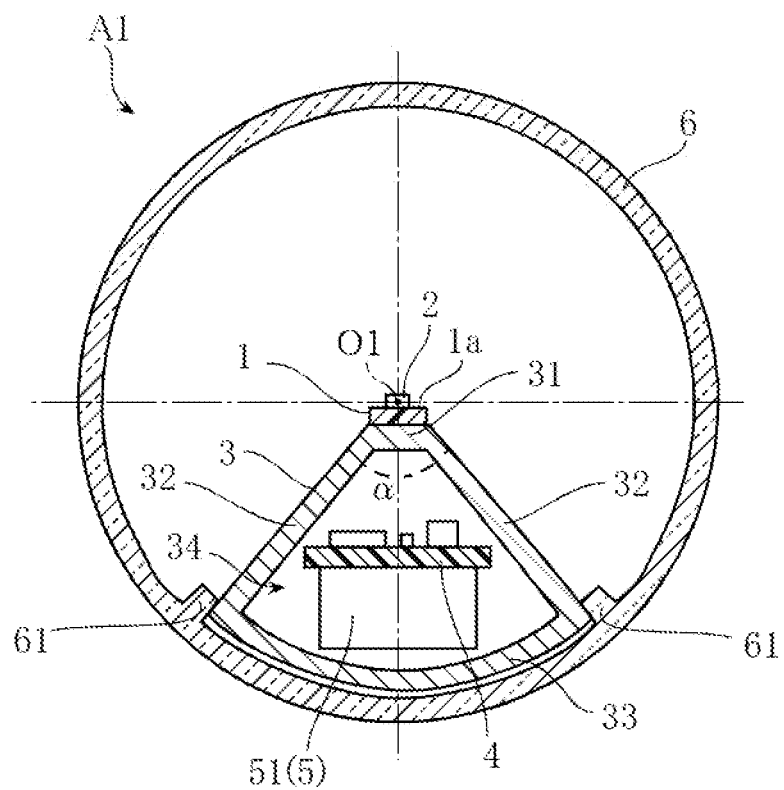
FIG. 2 is a fragmentary cross-sectional view taken along a line II-II in FIG. 1.
Figure 3:
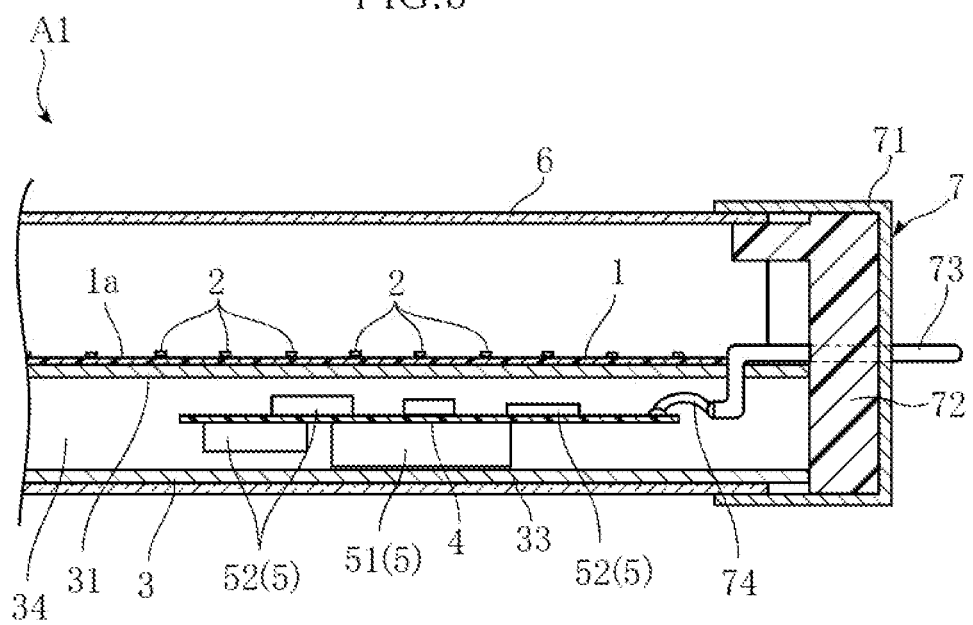
FIG. 3 is a fragmentary cross-sectional view taken along a line III-III in FIG. 1.

FIGS. 1 to 3 depict an LED lamp according to a first embodiment of the present invention. The LED lamp A1 according to this embodiment includes a substrate 1, a plurality of LED modules 2, a heat dissipation member 3, a circuit board 4, a plurality of power supply parts 5, a case 6, and a pair of bases 7. The LED lamp A1 may be attached, for example, to a home-use fluorescent illumination instrument as a substitute for a straight-tube fluorescent lamp. In the case where the home-use fluorescent illumination instrument is installed on a ceiling of a room for example, the LED lamp A1 is normally attached such that a main emission direction of the light from the LED modules 2 is oriented downward.

The substrate 1 serves to support the plurality of LED modules 2 and to supply power to the LED modules 2. The substrate 1 is for example constituted of a glass epoxy resin, and formed in a slender plate shape. Metal interconnect layers 11, 12 are provided on a mounting surface 1a of the substrate 1. The metal interconnect layers 11, 12 are constituted of copper for example, and spaced from each other. The substrate 1 also includes a cover layer 13 disposed so as cover a part of the metal interconnect layers 11, 12 for protection thereof.

Figure 4:
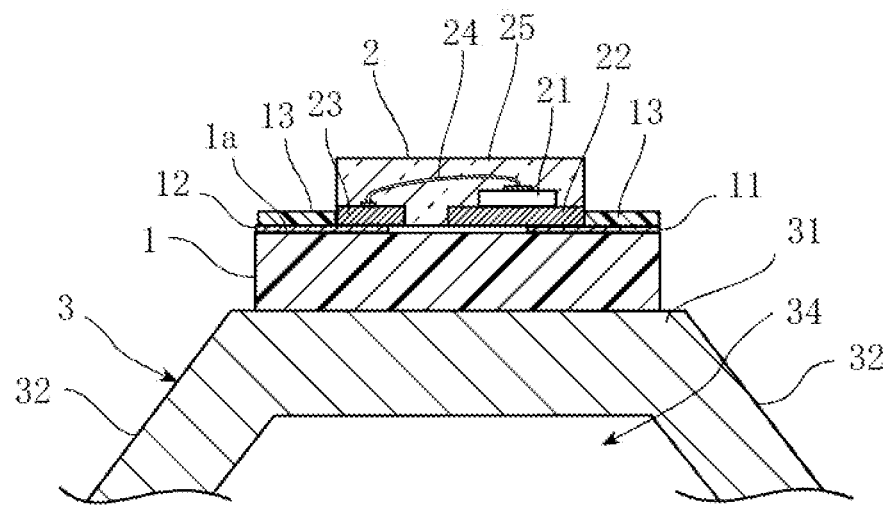
FIG. 4 is a fragmentary cross-sectional view of an LED module and a substrate.

The plurality of LED modules 2 is aligned in a longitudinal direction of the substrate 1, as shown in FIG. 1. The LED modules 2 each include, as shown in FIG. 4, a LED chip 21, metal leads 22, 23 spaced from each other, a wire 24, and resin package 25. The LED modules 2 are mounted such that the main emission direction of the LED chip 21 coincides with a direction of the normal of the mounting surface 1a of the substrate 1.

The LED chip 21 includes, for example, an n-type semiconductor, a p-type semiconductor, and an active layer disposed therebetween, though these are not shown. In the case where the LED chip 21 is constituted of a GaN-based semiconductor, the LED chip 21 can emit a blue light.

The LED chip 21 includes two electrodes (now shown). These electrodes are located on a lower surface and an upper surface of the LED chip 21, respectively. The LED chip 21 is mounted on a surface of the lead 22. The back surface of the lead 22 is connected to the metal interconnect layer 11 on the substrate 1. Accordingly, the electrode on the lower surface of the LED chip 21 is electrically connected to the metal interconnect layer 11. On the other hand, the electrode on the upper surface of the LED chip 21 is connected to the lead 23 through the wire 24. The lead 23 is connected to the metal interconnect layer 12. Thus, the electrode on the upper surface of the LED chip 21 is electrically connected to the metal interconnect layer 12.

The resin package 25 serves to protect the LED chip 21 and the wire 24. The resin package 25 is for example constituted of a silicon resin, which can transmit the light emitted from the LED chip 21. Also, mixing a fluorescent material that emits a yellow light upon being excited by a blue light in the resin package 25 allows the LED module 2 to emit a white light. Instead of the fluorescent material that emits the yellow light, a fluorescent material that emits a green color or a red color may be mixed.

Figure 5:
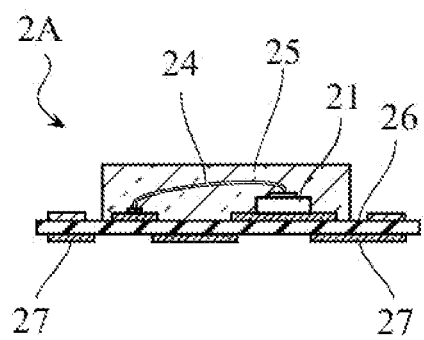
FIG. 5 is a fragmentary cross-sectional view of a variation of the LED module.

An LED module 2A shown in FIG. 5 may be employed in place of the LED module 2. The LED module 2A includes an insulation substrate 26. The LED chip 21 is mounted on the insulation substrate 26. On the back surface of the insulation substrate 26, a pair of mounting terminals 27 is provided. In the case, for example, where the LED module 2A is mounted on the substrate 1 shown in FIG. 4, the pair of mounting terminals 27 is connected to the metal interconnect layer 11, 12, respectively.

The heat dissipation member 3 serves to dissipate heat generated from the LED module 2, and is accommodated in the case 6. The heat dissipation member 3 is constituted of aluminum for example, and formed in a slender block shape extending in the longitudinal direction of the substrate 1. The heat dissipation member 3 includes an LED mount 31, a pair of slope portions 32, and an arcuate portion 33, and is formed in such a shape that has a hollow fan-shaped cross-section. The LED mount 31 is located at a position corresponding to the vertical angle of the fan shape, and formed in a slender strip shape. The substrate 1 is mounted on the LED mount 31. By mounting thus the substrate 1 on the LED mount 31, the plurality of LED modules 2 is aligned so as to coincide with the central axis O1 of the case 6, as shown in FIG. 2. The pair of slope portions 32 is connected to the respective sides of the LED mount 31, and constitutes a part corresponding to the radius of the fan shape. In this embodiment, the outer surface of the slope portions 32 is flat. The arcuate portion 33 connects the respective end portions of the pair of slope portions 32, and is formed in a shape having an arcuate cross-section.

The heat dissipation member 3 includes therein a hollow portion 34. In the hollow portion 34, the circuit board 4 and the plurality of power supply parts 5 are stored as shown in FIGS. 2 and 3. The circuit board 4 is, for example, constituted of a glass epoxy resin, and formed in a plate shape. The plurality of power supply parts 5 serves as a power supply circuit for activating the LED modules 2, and is mounted on the circuit board 4. The plurality of power supply parts 5 includes an AC/DC converter 51 and other functional parts 52 such as a capacitor and a resistor, and constitutes a circuit that converts an AC supplied from a commercial power supply into a constant DC and supplies the DC to the LED modules 2. Here, the AC/DC converter 51 is by far more voluminous than other parts mounted on the circuit board 4, and is hence often mounted, for example, on the back surface of the circuit board 4.

An angle α defined by the pair of slope portions 32 (see FIG. 2) is 90°, for example. The angle α may be determined at a desired angle depending on the travelling direction of the light emitted from the LED chip 21, the size of the circuit board 4 and the plurality of power supply parts 5 accommodated in the hollow portion 34, and so forth. Preferably, the angle α may be equal to or smaller than 180°.

The heat dissipation member 3 may be made insulative for example by providing an insulation sheet thereon, so that the LED modules 2 may be directly mounted thereon. In other words, the substrate 1 may be excluded. In this case, an interconnect pattern similar to that formed on the mounting surface 1a of the substrate 1 is provided between the LED modules 2 and the insulation sheet. Such a configuration eliminates the need to prepare the substrate 1 for mounting thereon the LED modules 2 in addition to the heat dissipation member 3, thereby contributing to reducing the parts cost.

It is not mandatory that the hollow portion 34 is formed over the entire length of the heat dissipation member 3, and a part of the heat dissipation member 3 in the longitudinal direction may have a solid structure.

The case 6 serves to accommodate therein the substrate 1 and the heat dissipation member 3, and has a cylindrical shape as shown in FIGS. 1 and 2. The case 6 is constituted of a synthetic resin such as polycarbonate, and integrally formed through an extrusion molding process. Once a portion of the light from the LED modules 2 reaches an inner surface of the case 6, the case 6 diffusingly transmits the light.

A pair of projections 61 is provided on the inner surface of the case 6. The pair of projections 61 is at a position offset from the mount surface of the LED mount 31 in the direction opposite to the main emission direction of the LED chip 21, sticks inwardly of the case 6, and serves to fix the heat dissipation member 3. In the state shown in FIG. 2, the heat dissipation member 3 is restricted from moving in a direction orthogonal to the central axis O1 of the case 6, because a portion of the slope portion 32 abuts the respective projection 61. To introduce the substrate 1 and the heat dissipation member 3 into the case 6, it is preferable to slide the heat dissipation member 3 along the projections 61 thus inserting the same into the case 6.

The pair of bases 7 serves to supply an AC from a commercial power supply upon being attached to a socket (not shown) of a home-use fluorescent illumination instrument. The base 7 includes, as shown in FIG. 3, a bottomed cylindrical cover 71, a resin block 72 fitted in a hollow portion of the cover 71, and two terminals 73. The heat dissipation member 3 is supported by the pair of bases 7. The terminal 73 and the circuit board 4 are connected through a cable 74. The terminal 73 is disposed so as to penetrate through the cover 71 and the resin block 72. An end portion (outer end portion) of the terminal 73 is to be fitted in a power outlet in a socket of a home-use fluorescent illumination instrument.

Advantages of the LED lamp A1 will now be described below.

Figure 6:
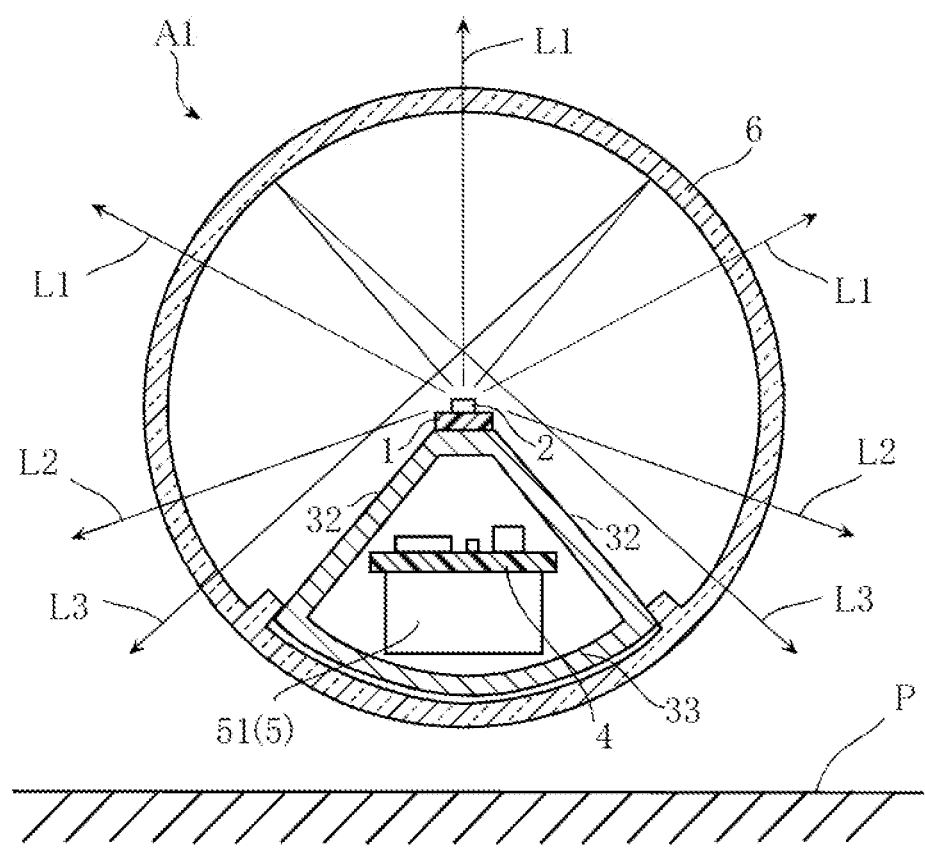
FIG. 6 is a diagram for explaining an operation of the LED lamp according to the first embodiment.

According to this embodiment, the pair of slope portions 32 of the heat dissipation member 3 is located in a position corresponding to a radius of the case 6 extending from the center thereof, as shown in FIG. 6. Accordingly, lights L1, L2 emitted from the LED modules 2 (LED chips 21) located along the central axis O1 of the case 6 are hardly blocked by the slope portions 32 (heat dissipation member 3).

Such a configuration allows the lights L1, L2 to illuminate a range of approx. 270° including in its center the main emission direction from the LED modules 2 (upward in FIG. 6). In particular, with the light L2 emitted obliquely downward in FIG. 6, and a light L3 reflected by the inner surface of the case 6 and then travelling obliquely downward, a ceiling P can be more brightly illuminated. Consequently, the use of the LED lamp A1 attached to a home-use fluorescent illumination instrument can suppress an uncomfortable feeling originating from such a situation that the illumination looks darker compared with a home-use fluorescent lamp.

Figure 7:
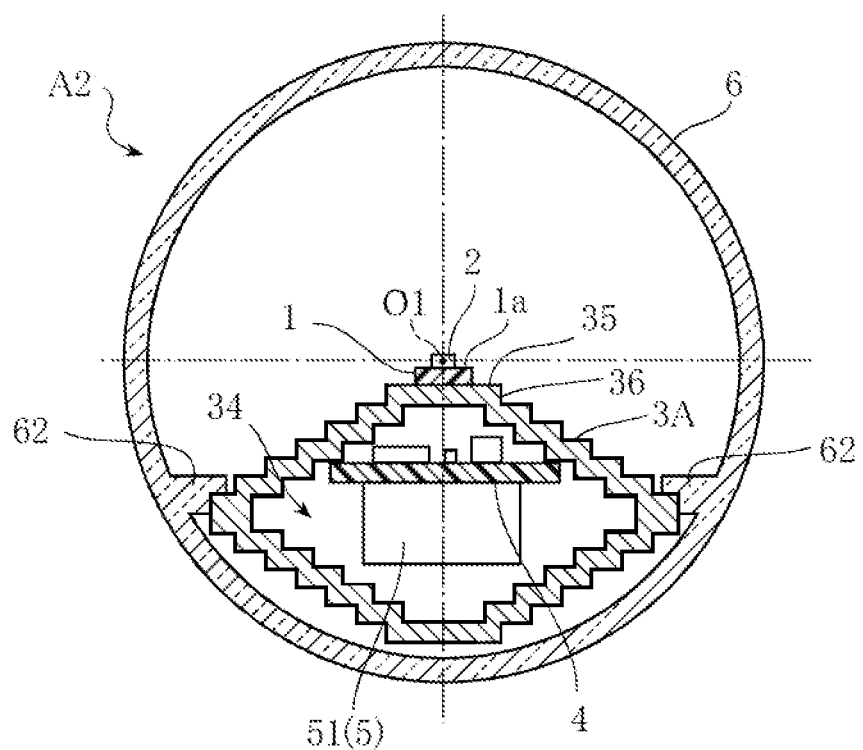
FIG. 7 is a fragmentary cross-sectional view of an LED lamp according to a second embodiment of the present invention.
Figure 8:
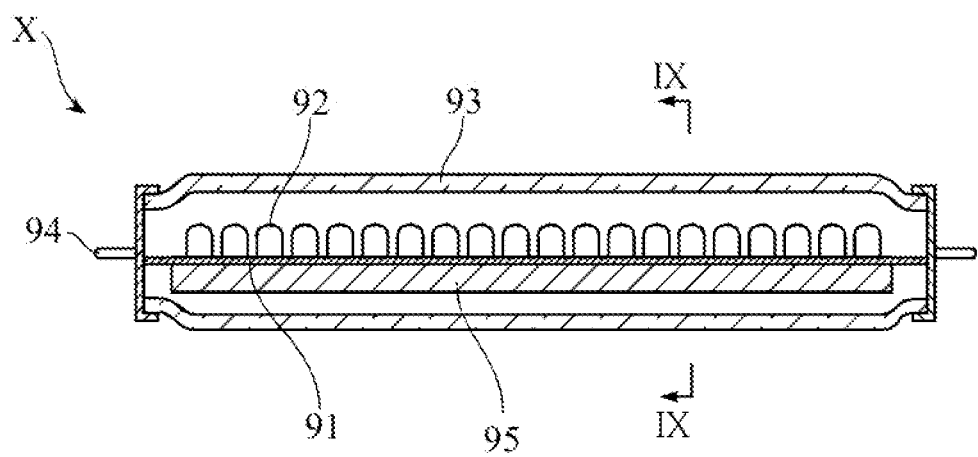
FIG. 8 is a cross-sectional view of an example of a conventional LED lamp.
Figure 9:
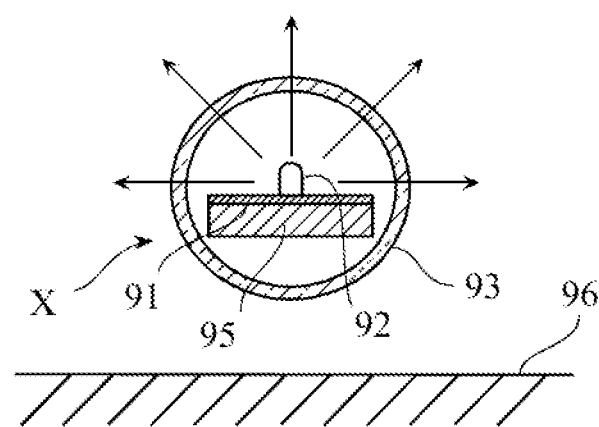
FIG. 9 is a fragmentary cross-sectional view taken along a line IX-IX in FIG. 8.

FIG. 7 depicts an LED lamp according to a second embodiment of the present invention. In FIG. 7, the constituents same as or similar to those of the foregoing the embodiment are given the same numeral.

The LED lamp A2 according to this embodiment is different from the LED lamp A1 of the first embodiment in the shape of the slope portions 32 of the heat dissipation member 3A. Specifically, the slope portions 32 according to this embodiment are formed in a stair shape including a plurality of horizontal surfaces 35 parallel to the mounting surface 1a of the substrate 1, and a plurality of vertical surfaces 36 formed in a direction orthogonal to the horizontal surfaces 35, the horizontal surfaces 35 and the vertical surfaces 36 being alternately formed.

The heat dissipation member 3A has an outer shape having a generally diamond-shaped cross-section, and includes a hollow therein. The heat dissipation member 3A is supported by a pair of projections 62 formed in the case 6. The inner surface of the hollow portion 34 in the heat dissipation member 3 is also formed in a stair shape including a plurality of horizontal surfaces and a plurality of vertical surfaces alternately formed, like the outer surface. Such a configuration allows the circuit board 4 to be easily mounted in the hollow portion 34, because the horizontal surfaces of the hollow portion 34 can be utilized for attaching the respective end portions of the circuit board 4. For example, in the case where the size of the circuit board 4 is different, one of the horizontal surfaces suitable for the size can be selected for attaching the circuit board 4.

From the LED lamp A2 also, the light from the LED modules 2 is emitted obliquely downward in FIG. 7, as the case of the LED lamp A1. Therefore, a region of a ceiling around a home-use fluorescent illumination instrument with the LED lamp A2 attached thereto can be more brightly illuminated, and the same advantage as offered by the LED lamp A1 can be obtained.

The LED lamp according to the present invention is in no way limited to the foregoing embodiment. Specific structure of each part of the LED lamp according to the present invention may be modified in various manners. For example, the heat dissipation member may be formed in a shape having a triangular cross-section, instead of the shape having the fan-shaped or diamond-shaped cross-section as the heat dissipation member 3 or 3A. Also, the surface of the slope portion 32 may be formed with fine projections and recesses.

The invention claimed is:
1. An LED lamp comprising:
an LED chip;
a heat dissipation member that supports the LED chip; and
a cylindrical case that accommodates therein the heat dissipation member and diffusingly transmits a light from the LED chip;

wherein the heat dissipation member includes:
an LED mount provided with a mount surface on which the LED chip is mounted, and a pair of slope portions each extending from the LED mount opposite a main emission direction of the LED chip and in a direction inclined with respect to the main emission direction,
wherein the mount surface of the LED mount is offset from a central axis of the case in a direction opposite to the main emission direction,
wherein the case includes a pair of projections inwardly protruding so as to hold the heat dissipation member therebetween,
wherein each of the pair of projections is offset from the mount surface of the LED mount in the direction opposite to the main emission direction, and said each of the pair of projections is held in contact with a corresponding one of the pair of slope portions.

2. The LED lamp according to claim 1, wherein the pair of slope portions are located so as to oppose each other across an axis passing the LED chip and extending in the main emission direction,
wherein the pair of slope portions are disposed so as to define therebetween an angle equal to or smaller than 180°, the angle being with respect to the direction opposite to the main emission direction.

3. The LED lamp according to claim 1, wherein the heat dissipation member is smaller in size in a radial direction of the case than a radius of the case.

4. The LED lamp according to claim 1, wherein each of the pair of slope portions of the heat dissipation member has a flat surface.

5. The LED lamp according to claim 1, wherein each of the pair of slope portions of the heat dissipation member has a stair-shaped surface.

6. The LED lamp according to claim 1, wherein the heat dissipation member includes therein a hollow portion, and
the hollow portion includes a circuit board that activates the LED chip.

7. An LED lamp comprising:
an LED chip;
a heat dissipation member including an LED mount provided with a mount surface on which the LED chip is mounted; and a cylindrical case that accommodates therein the heat dissipation member and diffusingly transmits a light from the LED chip;
wherein the case includes a pair of projections inwardly protruding so as to hold the heat dissipation member therebetween,
wherein the mount surface of the LED mount is offset from a central axis of the case in a direction opposite to a main emission direction of the LED chip,
wherein each of the pair of projections is offset from the mount surface of the LED mount in the direction opposite to the main emission direction, and
wherein the heat dissipation member has a fan-shaped cross-section including the LED mount and a pair of slope portions extending from the LED mount.

8. The LED lamp according to claim 7, wherein the pair of projections is engaged with a respective end portion of the pair of slope portions.

9. The LED lamp according to claim 8, wherein the pair of slope portions is disposed so as to define therebetween an angle equal to or smaller than 180°.

10. The LED lamp according to claim 9, wherein the heat dissipation member is smaller in size in a radial direction of the case than a radius of the case.

11. The LED lamp according to claim 7, wherein the heat dissipation member includes therein a hollow portion, and
the hollow portion includes a circuit board that activates the LED chip.

12. The LED lamp according to claim 11, wherein the heat dissipation member is formed in a slender shape.

13. The LED lamp according to claim 12, wherein the circuit board has a strip shape extending in a longitudinal direction of the heat dissipation member.

14. The LED lamp according to claim 13, wherein the pair of slope portions is disposed so as to define therebetween an angle equal to or smaller than 180°.

15. The LED lamp according to claim 14, wherein the heat dissipation member is smaller in size in a radial direction of the case than a radius of the case.

* * * * *